(12) United States Patent
Ou Yang et al.

(10) Patent No.: US 7,711,517 B2
(45) Date of Patent: May 4, 2010

(54) SYSTEM AND METHOD FOR TESTING THE ACCURACY OF REAL TIME CLOCKS

(75) Inventors: Ming-Shiu Ou Yang, Taipei Hsien (TW); Wei-Yuan Chen, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 14 days.

(21) Appl. No.: 12/107,784

(22) Filed: Apr. 23, 2008

(65) Prior Publication Data

US 2009/0055125 A1 Feb. 26, 2009

(30) Foreign Application Priority Data

Aug. 20, 2007 (CN) .......................... 2007 1 0201397

(51) Int. Cl.
*G04F 1/00* (2006.01)
(52) U.S. Cl. ...................................................... 702/178
(58) Field of Classification Search .................. 702/178; 713/500–503
See application file for complete search history.

(56) References Cited

U.S. PATENT DOCUMENTS

| 5,918,041 A | * | 6/1999 | Berstis | ........................ 713/503 |
| 7,079,977 B2 | * | 7/2006 | Osorio et al. | ............... 702/176 |
| 2004/0205368 A1 | | 10/2004 | Lange-Pearson et al. | |

* cited by examiner

*Primary Examiner*—Drew A Dunn
*Assistant Examiner*—Stephen J Cherry
(74) *Attorney, Agent, or Firm*—Frank R. Niranjan

(57) ABSTRACT

A method for testing the accuracy of real time clocks is disclosed. The method includes the steps of: setting test parameters for testing the accuracy of real time clocks (RTCs), the test parameters comprising a test time length, a test time sampling interval, and an acceptable margin; synchronizing the time of an RTC IC and an RTC to be tested via a UUT; reading a current time of the RTC IC and the RTC via the UUT at each test time sampling interval; calculating a time difference between the current time of the RTC IC and the RTC via the UUT, and measuring whether the absolute value of the time difference is less than the acceptable margin; detecting whether the test time length is over; repeating the test process if the test time length is not over, or outputting test pass information if the test time length is over. A related system is also disclosed.

10 Claims, 3 Drawing Sheets

SYSTEM AND METHOD FOR TESTING THE ACCURACY OF REAL TIME CLOCKS

BACKGROUND OF THE INVENTION

1. Field of the Invention

The present invention is related to a system and method for testing the accuracy of real time clocks.

2. Description of Related Art

Real time clocks (RTCs) are used in many electronic products such as personal computers, mobile phones, and computer servers. The accuracy of the real time clock is important to high performance requirements of the electronic products such as the computer servers. For this reason, it is common to test the accuracy of the real time clocks configured in such electronic products.

There are two methods to test the accuracy of the real time clock configured in a motherboard of a computer server on a product line. The first ways is as follows: an operator corrects the time of the RTC to be tested according to a standard RTC, calculates a time difference between the current time of the tested RTC and the standard RTC at a specified interval, and judges whether the time difference is less than an acceptable margin. If the time difference is less than the acceptable margin, the quality of the tested RTC is regarded as good. However, this kind of method may cause low efficiency and errors. Because there are only two records of time (i.e., at the beginning and the end), if the time difference is more than the acceptable margin between the beginning and the end, this kind of method does not detect the error. The quality of the tested RTC is regarded as good if the time difference is less than the acceptable margin at the end.

The second ways is as follows: reading time of a standard RTC from a sever via an application software through a network, reading time of a tested RTC in the motherboard of a computer server via the application software, and calculating a time difference between the read time of the tested RTC and the standard RTC. However, if the connection between the server and the network is intermitted or delayed, the accuracy of the test result will decline.

Therefore, what is needed is a system and method for automatically testing the accuracy of real time clocks.

SUMMARY OF THE INVENTION

A system for testing the accuracy of real time clocks is provided in accordance with a preferred embodiment. The system includes a unit under test (UUT). The UUT includes a real time clock (RTC) to be tested. The system further includes a fixture and a database connected to the UUT. The fixture includes an RTC integrated circuit (IC), a microcontroller, and a data converting chip. The microcontroller is configured for reading the initial time of the RTC IC, and sending the initial time to the data converting chip. The data converting chip is configured for converting the initial time sent from the microcontroller to data recognizable by the UUT, and sending the converted data to the UUT. The UUT further includes a test program, the test program includes: a parameters setting module being configured for setting test parameters for testing the accuracy of the RTC, and storing the test parameters in the database, the test parameters comprising a test time length, a test time sampling interval, and an acceptable margin for a time difference; a synchronizing module being configured for synchronizing the time of the RTC IC and the RTC when the test process has started; an obtaining module being configured for reading a current time of the RTC IC and the RTC at each test time sampling interval; an analyzing module being configured for calculating a time difference between the current time of the RTC IC and the current time of the RTC, and determining whether the accuracy of the RTC is satisfactory by measuring whether the absolute value of the time difference is less than the acceptable margin within the test time length.

A method for testing the accuracy of real time clocks is also provided. The method includes the steps of: (a) setting test parameters for testing the accuracy of real time clocks (RTCs), and storing the test parameters in a database, the test parameters comprising a test time length, a test time sampling interval, and an acceptable margin for a time difference; (b) reading the initial time of an RTC integrated circuit (IC) via a microcontroller when the test process has started, and sending the initial time to a data converting chip; (c) converting the initial time via the data converting chip to data recognizable by a unit under test (UUT), and sending the converted data to the UUT, the UUT comprising an RTC to be tested; (d) synchronizing the time of the RTC IC and the RTC via the UUT; (e) reading a current time of the RTC IC and the RTC via the UUT at each test time sampling interval; (f) calculating a time difference between the current time of the RTC IC and the current time of the RTC via the UUT, and measuring whether the absolute value of the time difference is less than the acceptable margin; (g) detecting whether the test time length is over if the absolute value of the time difference is less than the acceptable margin; (h) returning to step (e) if the test time length is not over, or outputting test pass information if the test time length is over.

Other systems, methods, features, and advantages of the present invention will become apparent to one with skill in the art upon examination of the following drawings and detailed description.

DETAILED DESCRIPTION OF THE INVENTION

Figure 1:
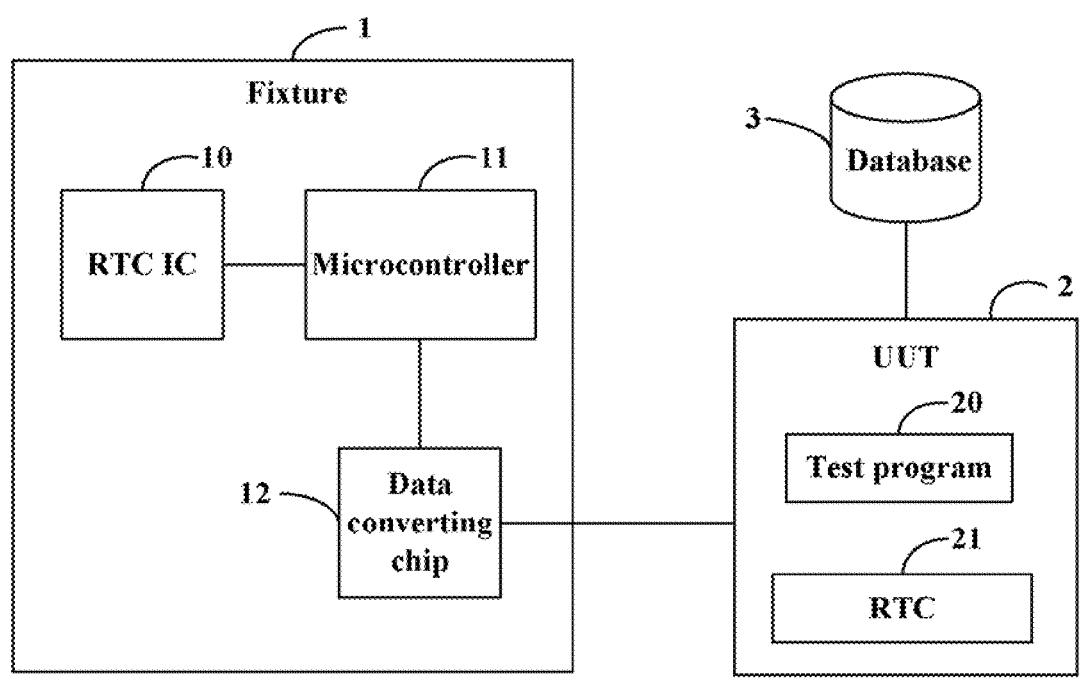
FIG. 1 is a schematic diagram of hardware configuration of a system for testing the accuracy of real time clocks in accordance with a preferred embodiment.

FIG. 1 is a schematic diagram of hardware configuration of a system for testing the accuracy of real time clocks (hereinafter, "the system") in accordance with a preferred embodiment. The system typically includes a fixture 1, a unit under test (UUT) 2, and a database 3. The fixture 1 may connect with the UUT 2 through an external I/O serial bus (e.g., RS232, IEEE1394, or USB). The UUT 2 may connect with the database 3 through a database connection. The database connection may be an open database connectivity (ODBC) or a java database connectivity (JDBC). The fixture 1 typically includes a real time clock (RTC) integrated circuit (IC) 10, a microcontroller 11, and a data converting chip (e.g., an I/O bridge chip) 12. The microcontroller 11 may connect with the RTC IC 10 and the data converting chip 12 through a multi-master serial computer bus (e.g., I2C or SPI). The data converting chip 12 connects with the UUT 2 through the external I/O serial bus. The RTC IC 10 can provide a reference time for the RTC. The microcontroller 11 is configured for reading the time of the RTC IC 10, and sending the time to the data converting chip 12. The data converting chip 12 converts the time sent from the microcontroller 11 to data recognizable by the UUT 2. That is to say, the data converting chip 12 converts multi-master serial computer bus data to external I/O serial bus data, and sends the external I/O serial bus data to the UUT 2.

The UUT 2 typically includes a test program 20 and an RTC 21 to be tested. The test program 20 is an application software for controlling/performing the test.

Figure 2:
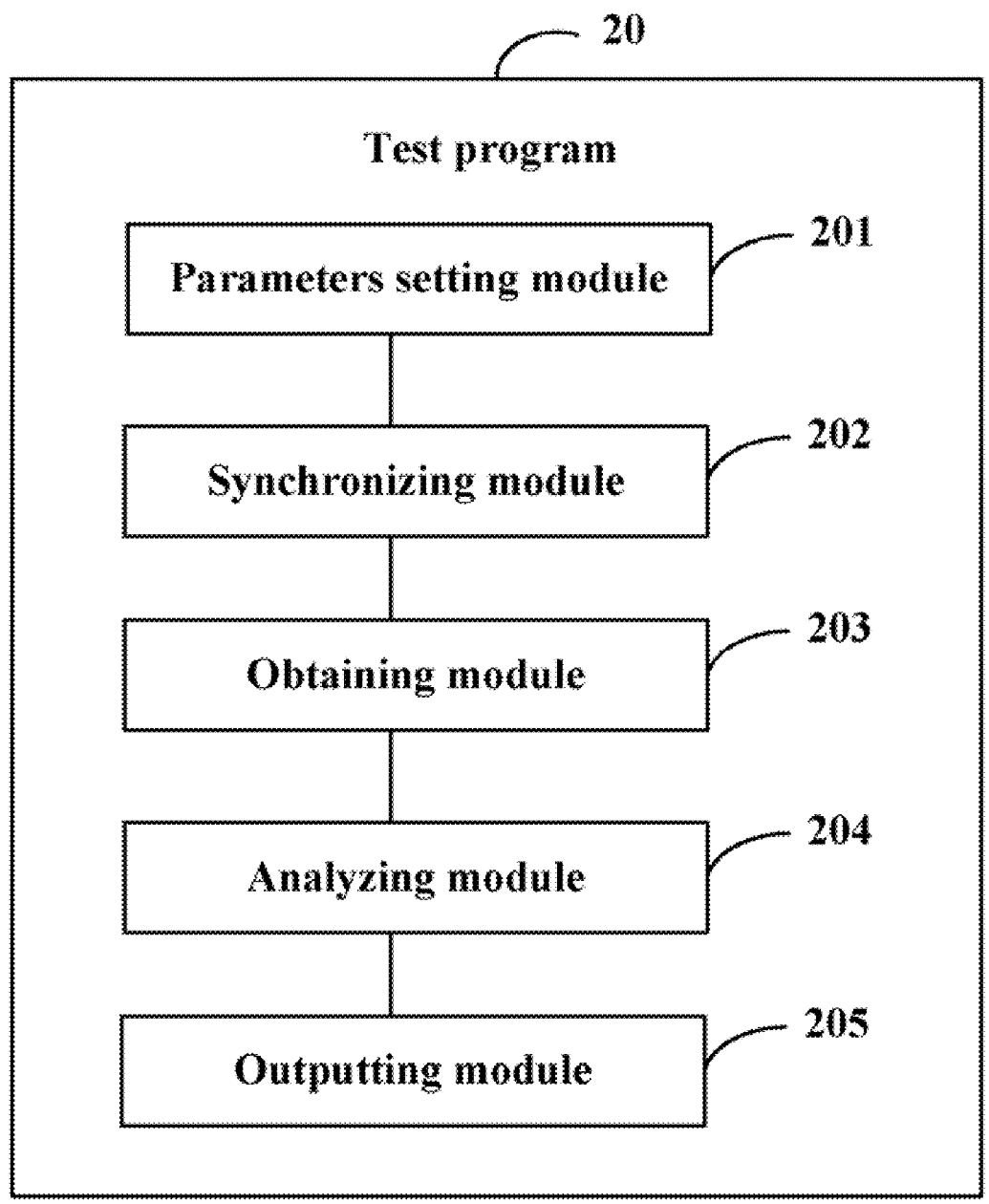
FIG. 2 is a schematic diagram showing function modules of a test program of FIG. 1.

FIG. 2 is a schematic diagram showing function modules of the test program 20 of FIG. 1. The test program 20 may include a parameters setting module 201, a synchronizing module 202, an obtaining module 203, an analyzing module 204, and an outputting module 205.

The parameters setting module 201 is configured for setting test parameters for testing the accuracy of the RTC 21, and storing the test parameters in the database 3. The test parameters may include a test time length, a test time sampling interval, and an acceptable margin.

The synchronizing module 202 is configured for synchronizing the time of the base RTC IC 10 and the RTC 21. A detailed description is as follows. At first, the microcontroller 11 reads the initial time of the RTC IC 10 when the test process has started, and sends the initial time to the data converting chip 12. The data converting chip 12 converts the initial time to the external I/O serial bus data, and sends the external I/O serial bus data to the synchronizing module 202. Then, the synchronizing module 202 adjusts the time of the RTC 21 according to the initial time, thereby completing the time synchronization between the RTC IC 10 and the RTC 21.

The obtaining module 203 is configured for reading a current time of the RTC IC 10 and the RTC 21 at each test time sampling interval. A detailed description is as follows. The obtaining module 203 sends a read time command to the fixture 1 at each test time sampling interval within the test time length. Then, the microcontroller 11 reads the current time of the RTC IC 10, and sends the current time to the data converting chip 12. The data converting chip 12 converts the current time to the external I/O serial bus data, and sends the external I/O serial bus data to the obtaining module 203. At the same time, the obtaining module 203 reads the current time of the RTC 21.

The analyzing module 204 is configured for calculating a time difference between the current time of the RTC IC 10 and the current time of the RTC 21, and measuring whether the absolute value of the time difference is less than the acceptable margin. If the absolute value of the time difference is less than the acceptable margin, the analyzing module 204 further measures whether an elapsed test time between the current time and the initial time is equal to or greater than the test time length (i.e., detects whether the test time length is over). If the test time length is not over (i.e., the elapsed test time between the current time and the initial time is less than the test time length), the test program continues, and the obtaining module 203 obtains a current time of the RTC IC 10 and the RTC 21 at the next test time sampling interval.

The outputting module 205 is configured for outputting test failure information if the absolute value of the time difference is greater than or equal to the acceptable margin, and outputting test pass information if the absolute value of the time difference is less than the acceptable margin within the test time length.

An example of testing the accuracy of real time clocks using the aforementioned system is as follows. At first, a user sets test parameters for testing the accuracy of the RTC 21 through the parameters setting module 201, and stores the test parameters in the database 3. The test parameters may include test time length, a test time sampling interval, and an acceptable margin. In the example, the test time length is one minute, the test time sampling interval is 5 seconds, and the acceptable margin is 0.05 seconds.

The microcontroller 11 reads the initial time of the RTC IC 10 when the test process has started, and sends the initial time to the data converting chip 12. The data converting chip 12 converts the initial time to the external I/O serial bus data, and sends the external I/O serial bus data to the synchronizing module 202. Then, the synchronizing module 202 adjusts the time of the RTC 21 according to the initial time, thereby completing the time synchronization between the RTC IC 10 and the RTC 21.

After five seconds, the obtaining module 203 reads the current time of the RTC IC 10 and the RTC 21. A detailed description is as follows. The obtaining module 203 sends the read time command to the fixture 1. Then, the microcontroller 11 reads the current time of the RTC IC 10, and sends the current time to the data converting chip 12. The data converting chip 12 converts the current time to the external I/O serial bus data, and sends the external I/O serial bus data to the obtaining module 203. At the same time, the obtaining module 203 reads the current time of the RTC 21.

The analyzing module 204 calculates a time difference between the current time of the RTC IC 10 and the current time of the RTC 21, and measures whether the absolute value of the time difference is less than 0.05 seconds. If the absolute value of the time difference is greater than or equal to 0.05 seconds, the outputting module 205 outputs the test failure information. If the absolute value of the time difference is less than 0.05 seconds, the analyzing module 204 further measures whether the elapsed test time between the current time and the initial time is equal to or greater than one minute (i.e., detects whether the test time length is over). If the test time length is not over (i.e., the elapsed test time between the current time and the initial time is less than one minute), the test program continues, and the obtaining module 203 obtains a current time of the RTC IC 10 and the RTC 21 at another five seconds. If the absolute value of the time difference is less than 0.05 seconds at each test time sampling interval within one minute, the outputting module 205 outputs the test pass information.

Figure 3:
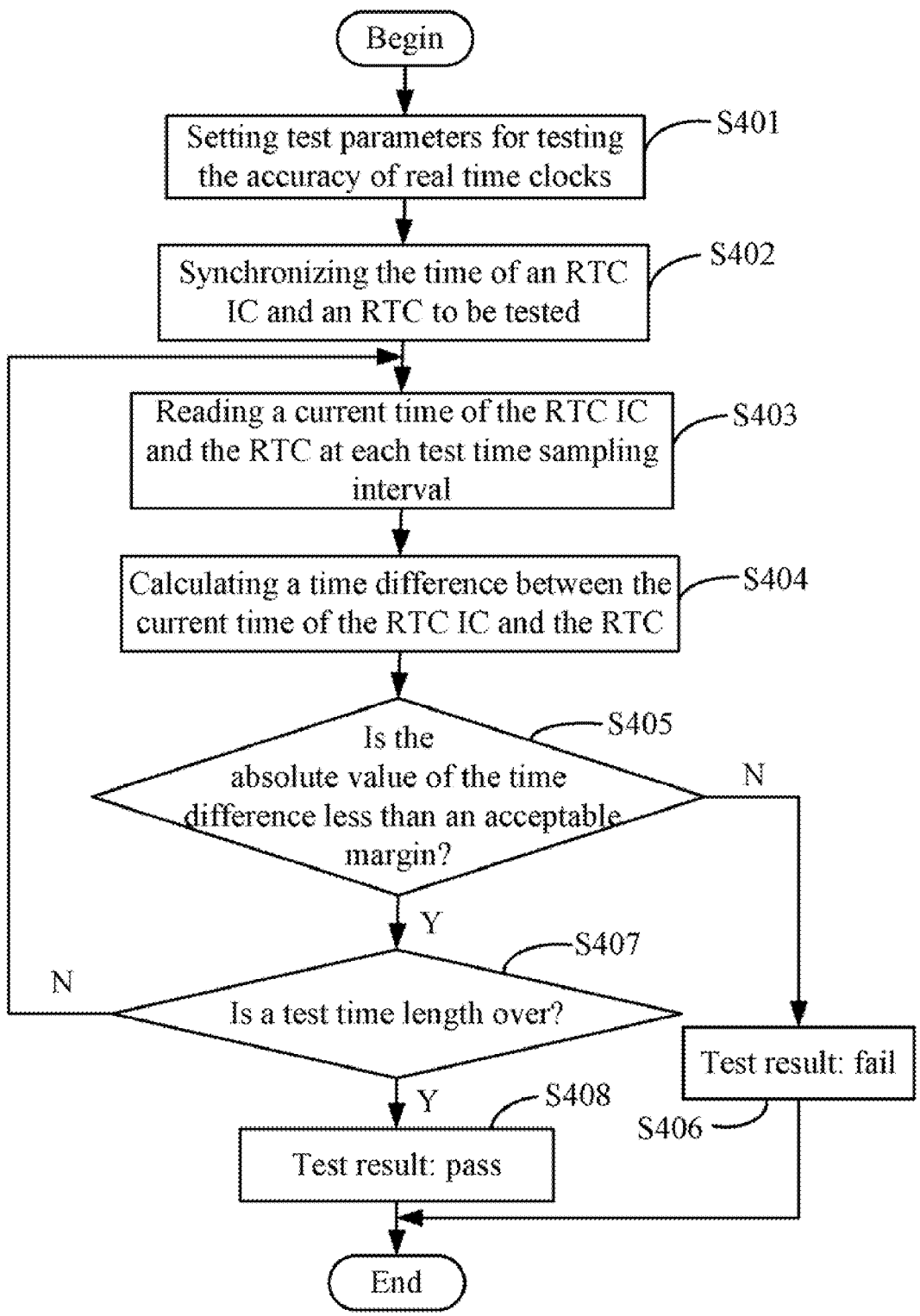
FIG. 3 is a flowchart of a preferred method for testing the accuracy of real time clocks in accordance with one embodiment.

FIG. 3 is a flowchart of a preferred method for testing the accuracy of real time clocks in accordance with one embodiment. In step S401, the user sets the test parameters for testing the accuracy of the RTC 21 through the parameters setting module 201, and storing the test parameters in the database 3. The test parameters may include the test time length, the test time sampling interval, and the acceptable margin.

In step S402, the synchronizing module 202 synchronizes the time of the base RTC IC 10 and the RTC 21. A detailed description is as follows. At first, the microcontroller 11 reads the initial time of the RTC IC 10 when the test process has started, and sends the initial time to the data converting chip 12. The data converting chip 12 converts the initial time to the external I/O serial bus data, and sends the external I/O serial bus data to the synchronizing module 202. Then, the synchronizing module 202 adjusts the time of the RTC 21 according to the initial time, thereby completing the time synchronization between the RTC IC 10 and the RTC 21.

In step S403, the obtaining module 203 reads the current time of the RTC IC 10 and the RTC 21 at each test time sampling interval. A detailed description is as follows. The obtaining module 203 sends the read time command to the fixture 1 at each test time sampling interval within the test time length. Then, the microcontroller 11 reads the current time of the RTC IC 10, and sends the current time to the data converting chip 12. The data converting chip 12 converts the current time to the external I/O serial bus data, and sends the external I/O serial bus data to the obtaining module 203. At the same time, the obtaining module 203 reads the current time of the RTC 21.

In step S404, the analyzing module 204 calculates the time difference between the current time of the RTC IC 10 and the current time of the RTC 21.

In step S405, the analyzing module 204 measures whether the absolute value of the time difference is less than the acceptable margin.

In step S406, if the absolute value of the time difference is greater than or equal to the acceptable margin, the outputting module 205 outputs the test failure information, and the procedure ends.

In step S407, if the absolute value of the time difference is less than the acceptable margin, the analyzing module 204 further measures whether the elapsed test time between the current time and the initial time is equal to or greater than the test time length (i.e., detects whether the test time length is over). If the absolute value of the time difference is less than the acceptable margin and the test time length is not over (i.e., the elapsed test time between the current time and the initial time is less than the test time length), the procedure goes to step S403.

In step S408, if the test time length is over, the outputting module 205 outputs the test pass information.

It should be emphasized that the above-described embodiments of the present invention, particularly, any preferred embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A system for testing the accuracy of real time clocks, the system comprising a unit under test (UUT), the UUT comprising a real time clock (RTC) to be tested;
the system further comprising a fixture and a database connected to the UUT, the fixture comprising an RTC integrated circuit (IC), a microcontroller, and a data converting chip, wherein the microcontroller connects with the RTC IC and the data converting chip through a multi-master serial computer bus, the data converting chip connects with the UUT through an external I/O serial bus;
the microcontroller being configured for reading the initial time of the RTC IC, and sending the initial time to the data converting chip;
the data converting chip being configured for converting the initial time of a format of the multi-master serial computer bus sent from the microcontroller to data of a format of the external I/O serial bus recognizable by the UUT, and sending the converted data to the UUT;
the UUT further comprising a test program, the test program comprising:
a parameters setting module being configured for setting test parameters for testing the accuracy of the RTC, and storing the test parameters in the database, the test parameters comprising a test time length, a test time sampling interval, and an acceptable margin for a time difference;
a synchronizing module being configured for synchronizing the time of the RTC IC and the RTC when the test process has started;
an obtaining module being configured for reading a current time of the RTC IC and the RTC at each test time sampling interval; and
an analyzing module being configured for calculating a time difference between the current time of the RTC IC and the current time of the RTC, and determining whether the accuracy of the RTC is satisfactory by measuring whether the absolute value of the time difference is less than the acceptable margin within the test time length.

2. The system according to claim 1, wherein the test program further comprises an outputting module configured for outputting test failure information if the absolute value of the time difference is greater than or equal to the acceptable margin, and for outputting test pass information if the absolute value of the time difference is less than the acceptable margin within the test time length.

3. The system according to claim 1, wherein the synchronizing module synchronizes the time of the RTC according to the initial time of the RTC IC.

4. The system according to claim 1, wherein the obtaining module reading the current time of the RTC IC and the RTC comprises:
sending a read time command to the fixture at each test time sampling interval within the test time length;
reading the current time of the RTC IC by the microcontroller, and sending the current time to the data converting chip; and
converting the current time to data of the format of the external I/O serial bus by the data converting chip, and sending the converted data to the obtaining module, then, the obtaining module reads the current time of the RTC.

5. The system according to claim 1, wherein the analyzing module is further configured for determining the test time length is over upon the condition that an absolute value of a time difference between the current time and the initial time is equal to or greater than the test time length, or determining the test time length is not over upon the condition that an absolute value of a time difference between the current time and the initial time is less than the test time length.

6. A method for testing the accuracy of real time clocks, the method comprising:

(a) setting test parameters for testing the accuracy of real time clocks (RTCs), and storing the test parameters in a database, the test parameters comprising a test time length, a test time sampling interval, and an acceptable margin for a time difference;

(b) reading the initial time of an RTC integrated circuit (IC) via a microcontroller when the test process has started, and sending the initial time to a data converting chip, wherein the microcontroller connects with the RTC IC and the data converting chip through a multi-master serial computer bus, the data converting chip connects with a unit under test (UUT) through an external I/O serial bus;

(c) converting the initial time of a format of the multi-master serial computer bus via the data converting chip to data of a format of the external I/O serial bus recognizable by the UUT, and sending the converted data to the UUT, the UUT comprising an RTC to be tested;

(d) synchronizing the time of the RTC IC and the RTC via the UUT;

(e) reading a current time of the RTC IC and the RTC via the UUT at each test time sampling interval;

(f) calculating a time difference between the current time of the RTC IC and the current time of the RTC via the UUT, and measuring whether the absolute value of the time difference is less than the acceptable margin;

(g) detecting whether the test time length is over if the absolute value of the time difference is less than the acceptable margin; and (h) returning to step (e) if the test time length is not over, or outputting test pass information if the test time length is over.

7. The method according to claim 6, further comprising:

outputting test failure information if the absolute value of the time difference is greater than or equal to the acceptable margin.

8. The method according to claim 6, wherein synchronizing the time of the RTC according to the initial time of the RTC IC.

9. The method according to claim 6, wherein reading the current time of the RTC IC and the RTC comprises:

sending a read time command to the fixture at each test time sampling interval within the test time length;

reading the current time of the RTC IC by the microcontroller, and sending the current time to the data converting chip; and converting the current time to data of the format of the external I/O serial bus by the data converting chip, and sending the converted data to the obtaining module, then, the obtaining module reads the current time of the RTC.

10. The method according to claim 6, wherein detecting whether the test time length is over comprises:

determining the test time length is over upon the condition that an absolute value of a time difference between the current time and the initial time is equal to or greater than the test time length; or determining the test time length is not over upon the condition that an absolute value of a time difference between the current time and the initial time is less than the test time length.

* * * * *